United States Patent
Sugio

(10) Patent No.: US 7,557,666 B2
(45) Date of Patent: Jul. 7, 2009

(54) OSCILLATION CIRCUIT

(75) Inventor: Kenichirou Sugio, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 116 days.

(21) Appl. No.: 11/712,584

(22) Filed: Mar. 1, 2007

(65) Prior Publication Data

US 2007/0268082 A1    Nov. 22, 2007

(30) Foreign Application Priority Data

May 16, 2006    (JP)    ............................. 2006-136032

(51) Int. Cl.
*H03B 5/36*    (2006.01)
(52) U.S. Cl. .................. 331/116 R; 331/109; 331/158; 331/183
(58) Field of Classification Search .................. 331/109, 331/116 R, 158, 183
See application file for complete search history.

(56) References Cited

U.S. PATENT DOCUMENTS

| | | | | |
|---|---|---|---|---|
| 4,710,730 A | * | 12/1987 | Doyle, III | .............. 331/116 FE |
| 4,999,588 A | * | 3/1991 | Koch | .......................... 331/109 |
| 5,481,228 A | * | 1/1996 | Badyal | .......................... 331/74 |
| 5,999,062 A | * | 12/1999 | Gilbert | .................... 331/116 R |
| 6,133,801 A | * | 10/2000 | Tanaka | .......................... 331/158 |
| 6,177,847 B1 | * | 1/2001 | Nagasue | ............... 331/116 FE |
| 6,329,884 B1 | * | 12/2001 | Tsukagoshi et al. | .... 331/116 FE |

FOREIGN PATENT DOCUMENTS

JP    2004-015314    1/2004

* cited by examiner

*Primary Examiner*—Robert Pascal
*Assistant Examiner*—Levi Gannon
(74) *Attorney, Agent, or Firm*—Studebaker & Brackett PC; Donald R. Studebaker

(57) ABSTRACT

An oscillation circuits includes an oscillation unit 30 for generating an internal clock signal having an amplitude of vibration corresponding to an internal power supply voltage thereof, switches 28, 29, a NMOS 13 of a tolerant input circuit, a first-stage driver 15, and a coupling capacitance 27. The switches 28, 29 are turned off when the external clock signal is inputted to a clock terminals 1, 2, and are turned on when the oscillation unit 30 oscillates. The NMOS 13 changes the amplitude of the input clock signal by the on-resistance and the outputs the above input clock signal from the drain electrode. The first-stage driver 15 drives the output of the drain electrode of the NMOS 13 and outputs the output thereof as a clock signal. The coupling capacitance 27 changes the gate voltage of the NMOS 13 when the input clock signal rises so as to keep the above on-resistance constant.

8 Claims, 8 Drawing Sheets

Oscillation circuit according to the second embodiment of the invention.

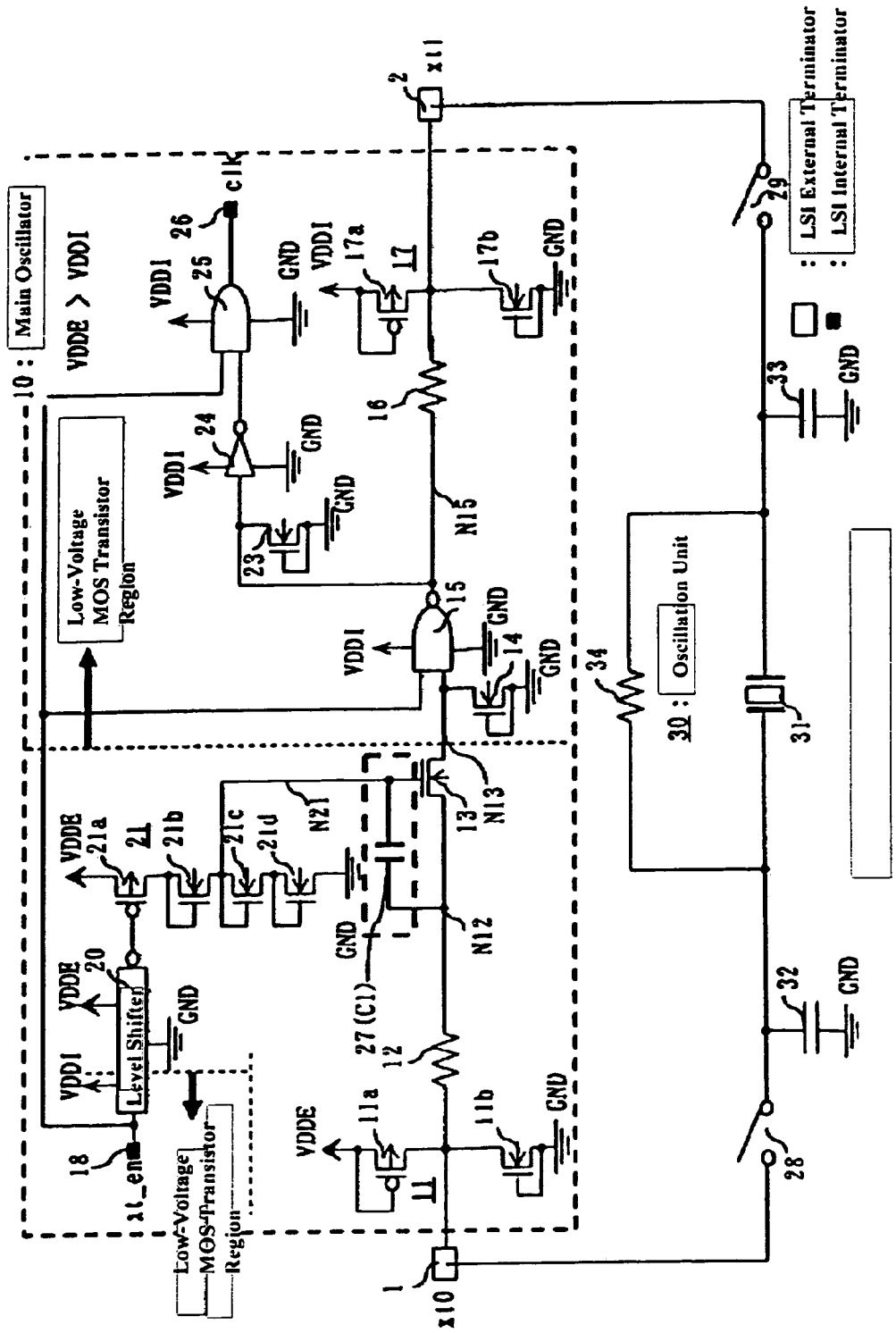
Fig. 1 Oscillation circuit according to the first embodiment of the invention.

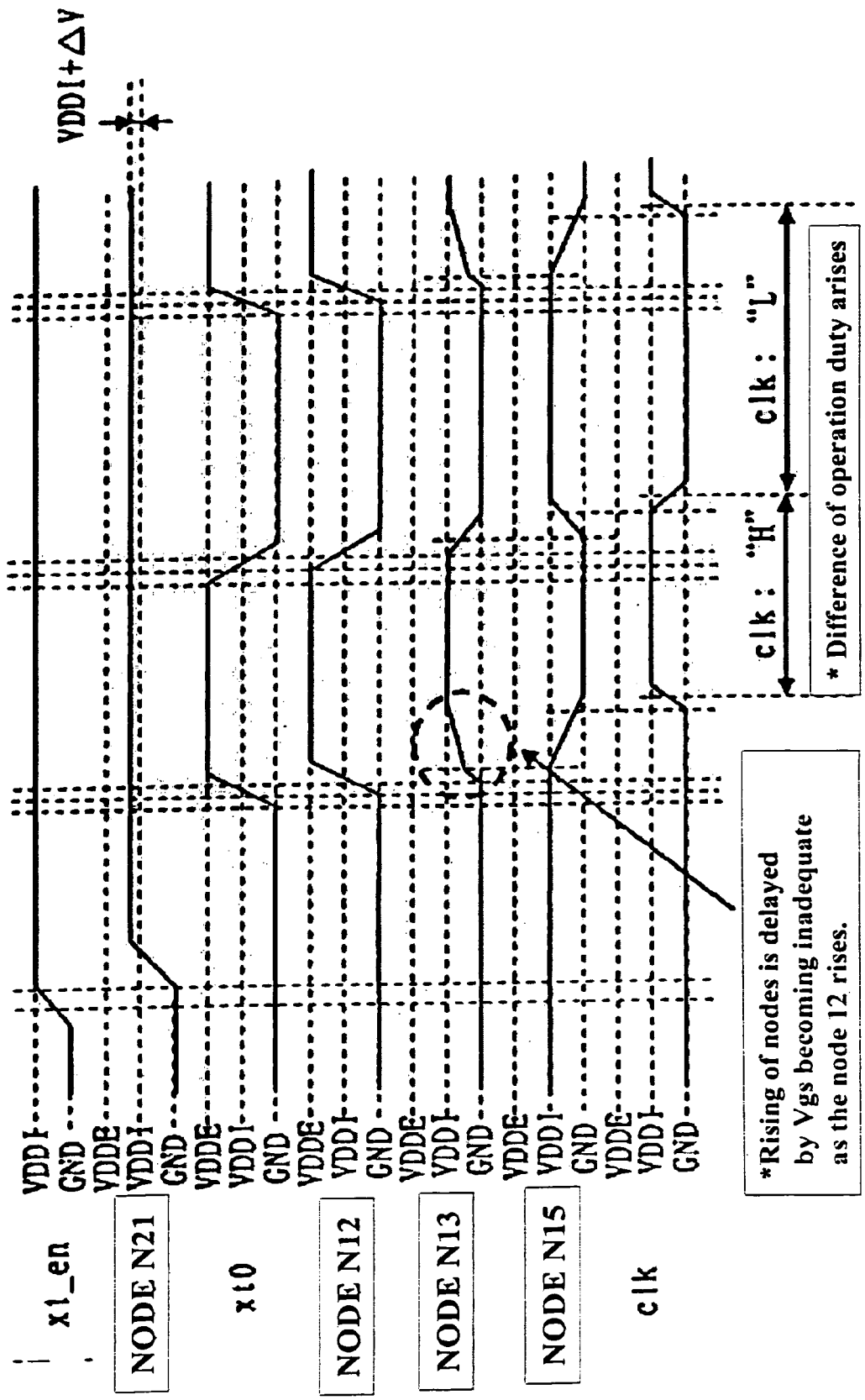
Fig. 2 Timing chart when the external clock inputs in the case where the capacitance 27 of Fig. 1 is not included.

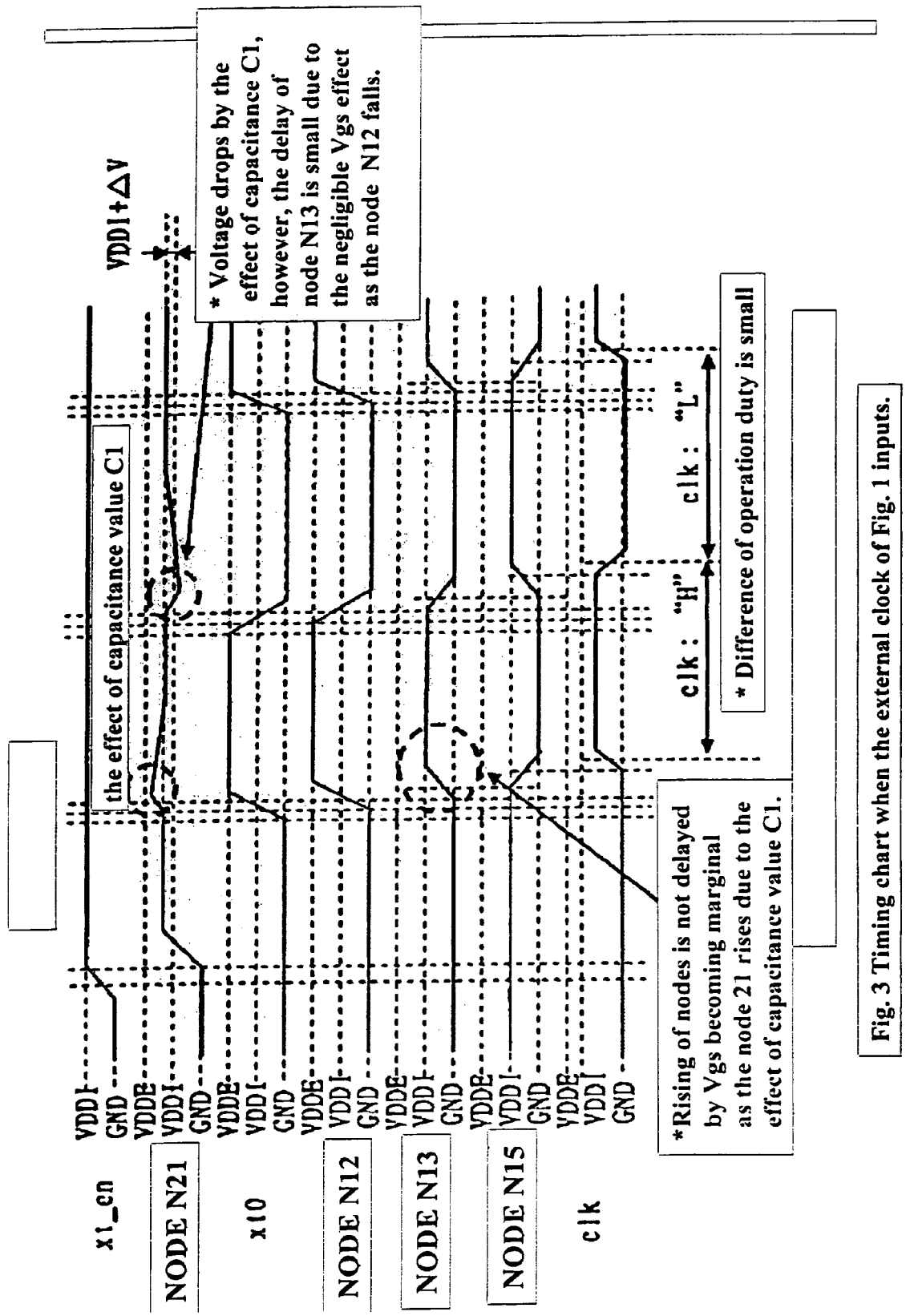
Fig. 3 Timing chart when the external clock of Fig. 1 inputs.

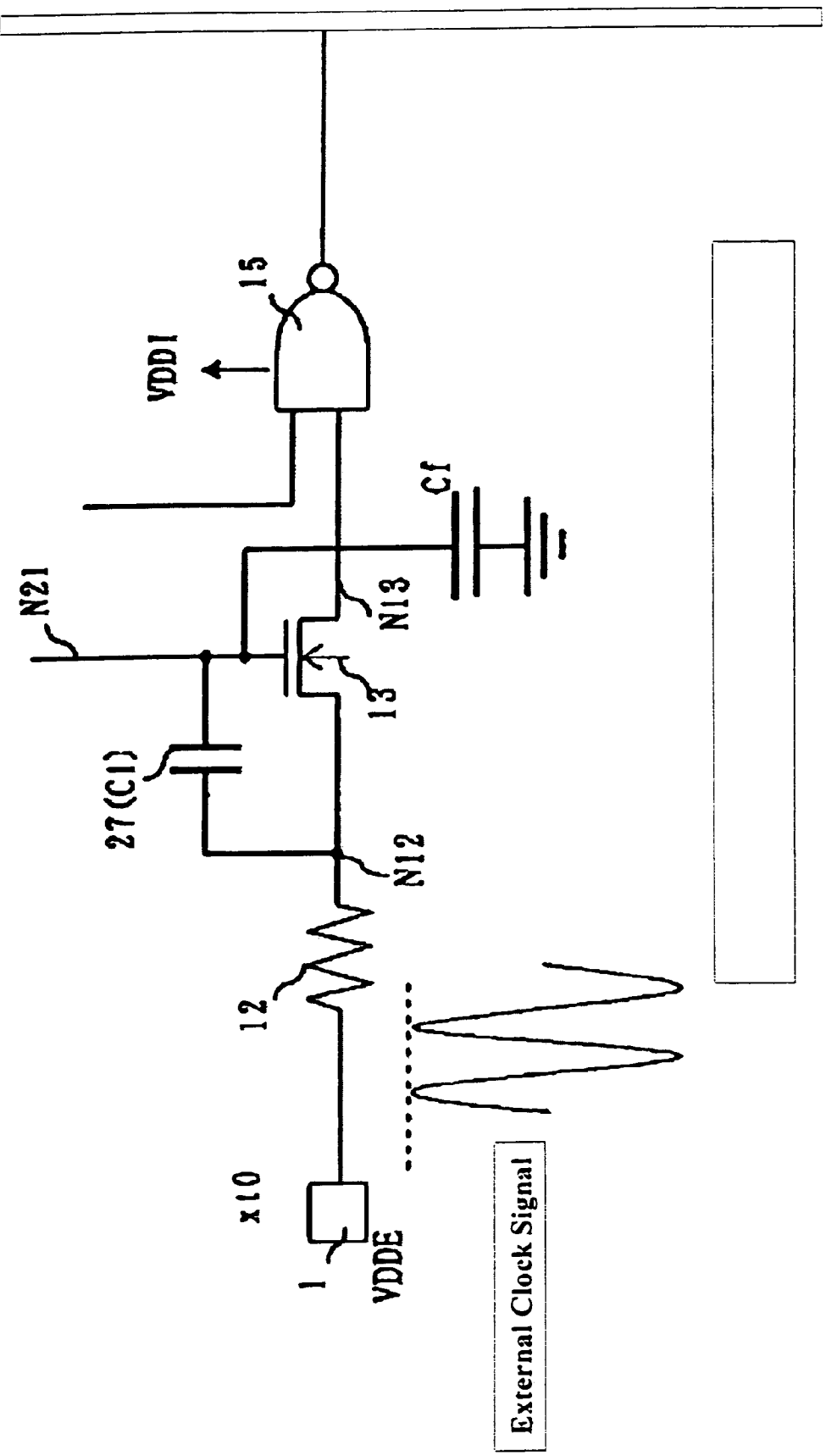
Fig. 4 Capacitance Value C1 of Coupling Capacitance 27 of Fig. 1

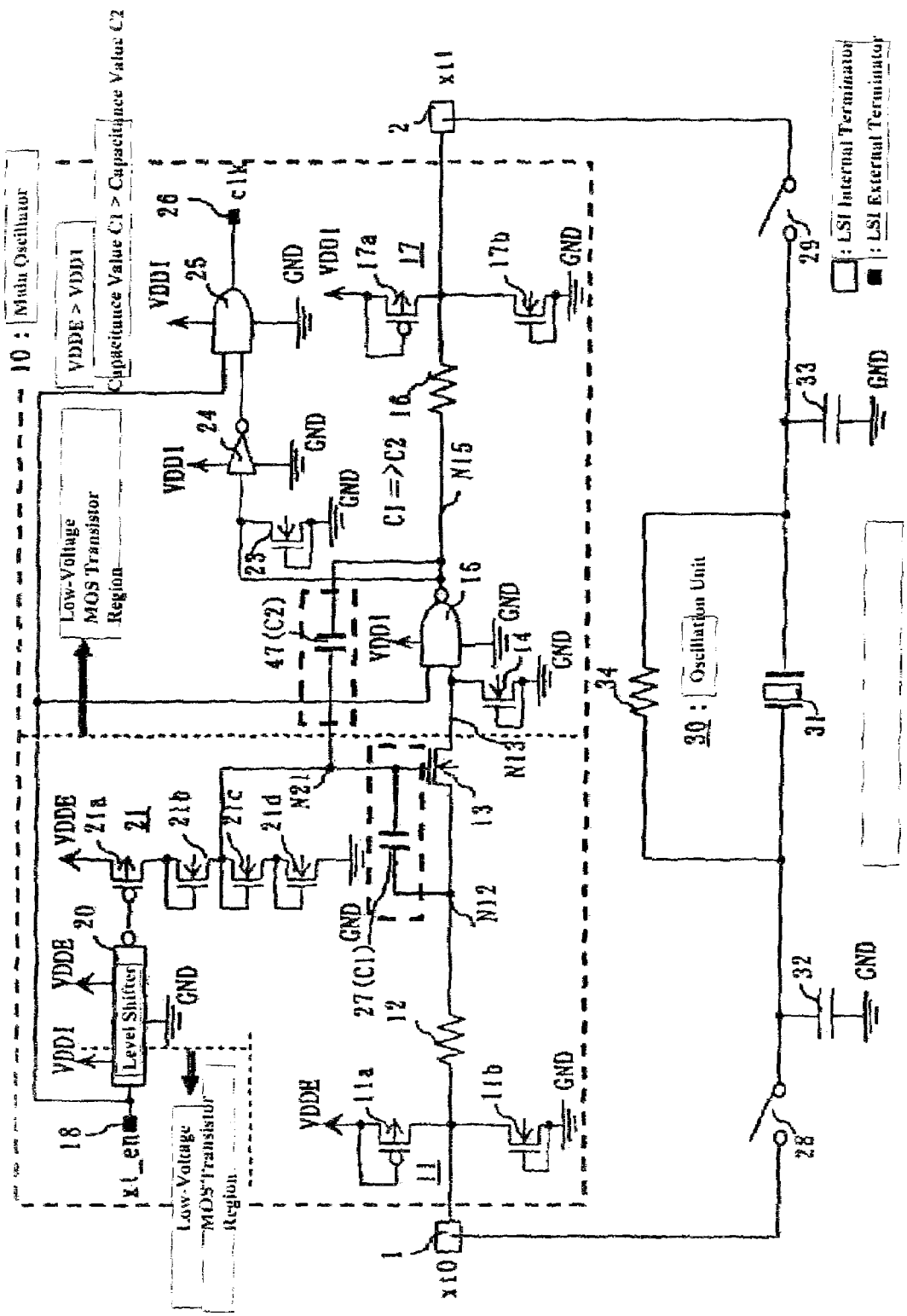
Fig. 5 Oscillation circuit according to the second embodiment of the invention.

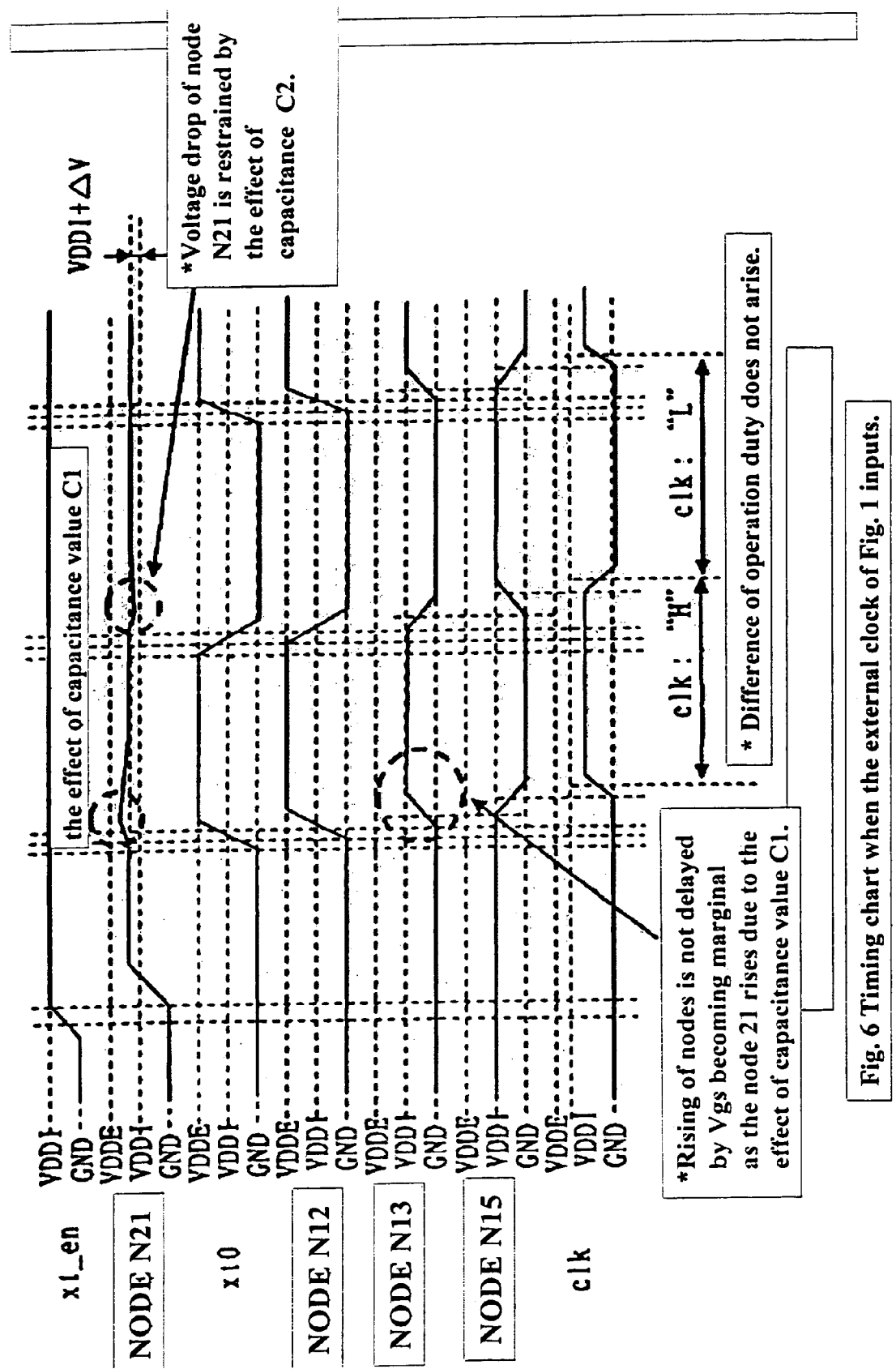
Fig. 6 Timing chart when the external clock of Fig. 1 inputs.

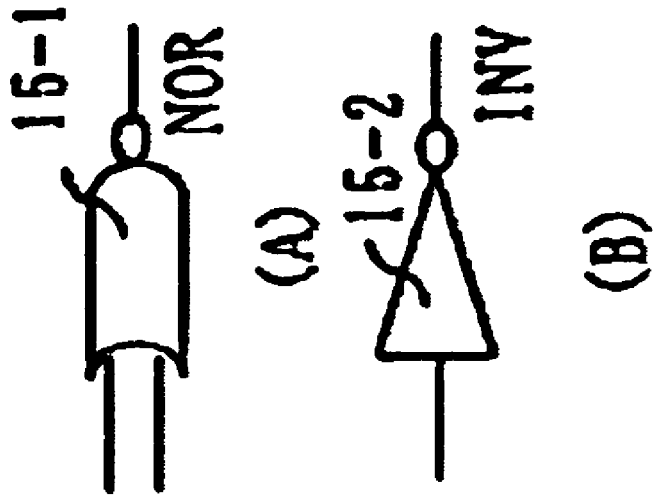
Fig. 7 Other First-Stage Drivers than Fig. 1 and Fig. 5

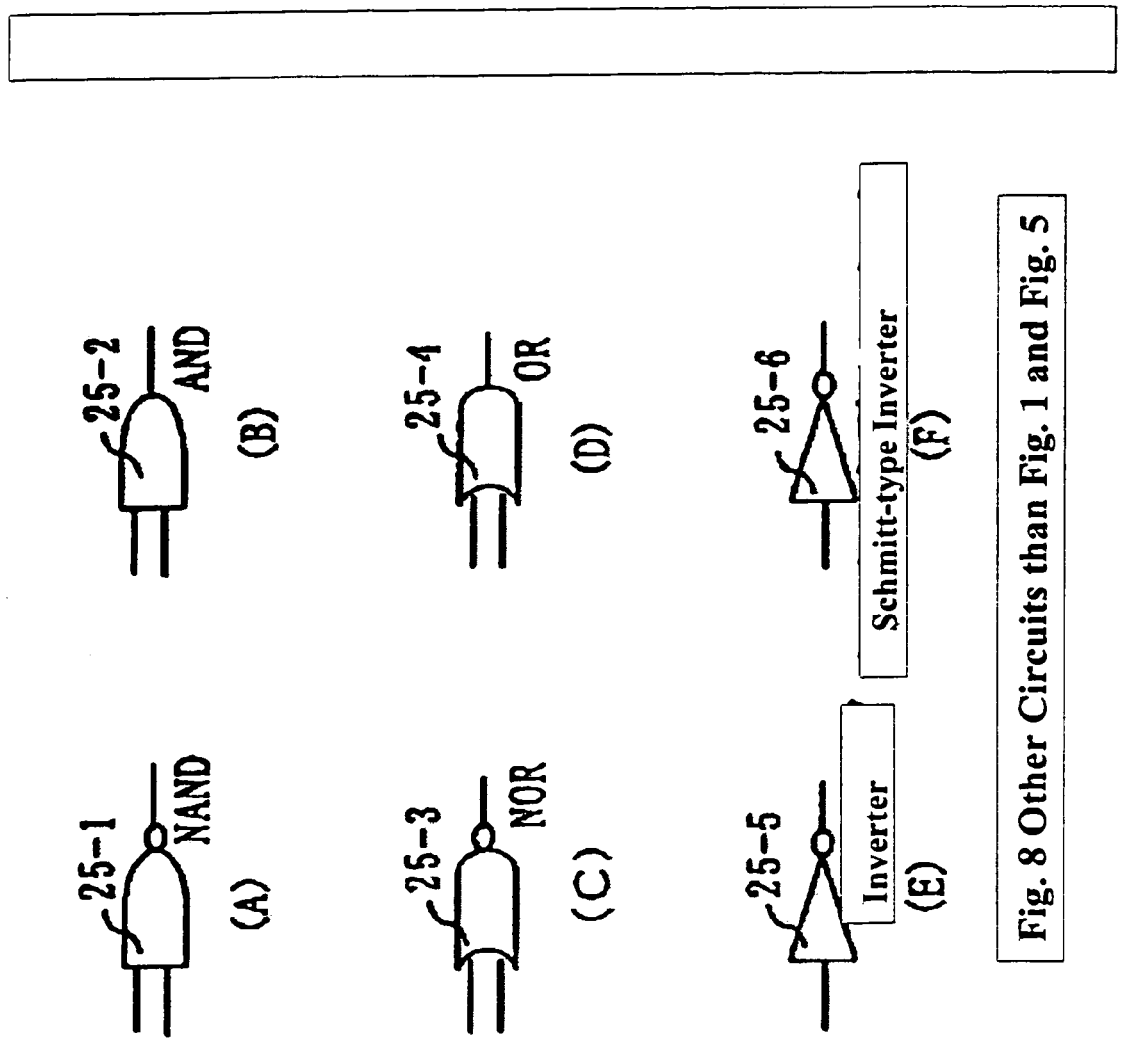
Fig. 8 Other Circuits than Fig. 1 and Fig. 5

OSCILLATION CIRCUIT

BACKGROUND OF THE INVENTION

1. Field of the Invention

The present invention relates to an oscillation circuit, for example, such as crystal oscillation circuit having a tolerant input circuit to lower the input signal level to a lower level than the transistor rated voltage.

This is a counterpart of Japanese patent application Serial Number 136032/2006, filed on May 16, 2006, the subject matter of which is incorporated herein by reference.

2. Description of the Related Art

Conventionally, there is a technology disclosed in the following document as a technology to operate crystal oscillation circuit at low (power supply) voltage.

Patent Document Japanese Patent Laid-Open Number 2004-015314

Some of the low-(power supply)voltage-operating crystal oscillation circuits being disclosed in the above patent document 1 include tolerant input circuits having a function of limit resistance on the input side of the first-stage driver within the crystal oscillation circuit against the case where external clock signal swinging to higher voltage than the above low voltage of crystal oscillation circuit. A MOS transistor (for example, N-cannel type MOS transistor, hereinafter referred to as "NMOS") having the source electrode connected to the external clock terminal side, the drain electrode connected to the input side of the first-stage driver, and the gate electrode inputted the given voltage can be taken as an example of the above tolerant input circuit.

When an external clock signal having bigger amplitude than the is inputted to the above crystal oscillation circuit, the circuit thereof changes the external clock signal to a clock signal having smaller amplitude than the rated voltage of the low-voltage transistor consisting the first-stage driver by the on-state resistance (hereinafter referred to as "on-resistance") of the NMOS of the input tolerant circuit, and then the above clock signal is driven by the first-stage driver and outputted from the clock output terminal as the clock signal.

SUMMARY OF THE INVENTION

Problem to be Solved:

However, the conventional crystal oscillation circuit has a problem as follows.

In the above mentioned NMOS of the input tolerant circuit, the gate electrode voltage (gate voltage) is kept approximately constant to keep the above on-resistance constant. The external clock signal having the lager amplitude than the low voltage is inputted and the source electrode side voltage (drain voltage) of the NMOS providing the input tolerant circuit rises, therefore the drain side voltage (drain voltage) gradually rises. Since the threshold voltage Vt rises by the substrate effect of the NMOS caused by the above drain voltage rising, the rising of the drain voltage is delayed in NMOS of the tolerant input circuit. Subsequently, the high-logic-level (hereinafter referred to as "H") period of the clock signal becomes shorter and the low-logic-level (hereinafter referred to as "L") period becomes longer within the operation duty (duty: on/off-state period of the operation) of the clock signal being driven by the first-stage driver and outputted from the clock output terminal. Then, a problem of being unable to meet the duty standard arises in the case where the duty standard is around 50%±10%

The object of present invention is providing an oscillation circuit being able to restrain the duty variation when the external clock signal is inputted, by eliminating rising or falling delay of the transistor of the tolerant input circuit to solve the aforementioned conventional problem.

Solution to the Problem:

An oscillation circuit according to the present invention includes an oscillation unit for generating an internal clock having the amplitude corresponding to the internal power supply voltage, a switch, a MOS transistor of the tolerant input circuit, a driver, and a first coupling capacitance.

The above switch is turned off when the external clock having the larger amplitude than the above internal power supply voltage is provided, and the above switch is turned on to output the above clock signal generated by the above oscillation unit from the above clock terminal when the oscillation unit oscillates. The above MOS transistor of the tolerant input circuit includes a source electrode provided with the input clock signal having the amplitude corresponding to the signal from the above clock terminal, a drain electrode for outputting, and a gate electrode being provided with the given voltage to change the on-resistance between the above first and the second electrode, and then outputs the above input clock signal from the second electrode after changing the amplitude of the input clock signal thereof by changing the above on-resistance.

The above driver drives the output of the drain electrode of the above MOS transistor and outputs the clock signal. Furthermore, the above coupling capacitance is connected between the source electrode and the gate electrode of the above MOS transistor and changes the above gate electrode voltage to keep the above on-resistance constant when the above input clock signal rises.

Effect of the Invention:

Since the oscillation circuit according to the present invention includes the first coupling capacitance, the on-resistance of the transistor of the tolerant input circuit can be kept constant to restrain the delay at the above transistor by coupling at the input clock signal rising, and then the variation of the operation duty of the input clock signal can be restrained.

Since another oscillation circuit according to the present invention includes the second coupling capacitance, at the control voltage drop at the transistor of the tolerant input circuit can be prevented at the input clock signal falling, and then the variation of the operation duty caused by the signal delay can be restrained when the input clock signal falls, too.

BRIEF DESCRIPTION OF THE DRAWINGS

FIG. 1: A view of general configuration diagram of a crystal oscillation circuit in accordance with the first embodiment of the present invention.

FIG. 2: A view of timing chart showing operation waveforms of an operation when an external clock inputs in the case where the coupling capacitance 27 is not included in the crystal oscillation circuit of FIG. 1.

FIG. 3: A view of timing chart showing operation waveforms of an operation when an external clock inputs in the case where the coupling capacitance 27 is included in the crystal oscillation circuit of FIG. 1.

FIG. 4: A view of explanatory diagram of calculation method for a capacitance value C1 of the coupling capacitance 27 of FIG. 1.

FIG. 5: A view of general configuration diagram of a crystal oscillation circuit in accordance with the second embodiment of the present invention.

FIG. 6: A view of timing chart showing operation waveforms of an operation when an external clock inputs in the case where the coupling capacitance 47 is added to the crystal oscillation circuit of FIG. 5.

FIG. 7: A view of configuration diagram of other first-stage circuits than ones of FIG. 1 and FIG. 5 showing the third embodiment of the present invention.

FIG. 8: A view of configuration diagram of other output circuits than ones of FIG. 1 and FIG. 5 showing the third embodiment of the present invention.

DETAILED DESCRIPTION OF THE PREFERRED EMBODIMENTS

An oscillation circuit includes an oscillation unit, a switch, a transistor of a tolerant input circuit, a driver, and a first coupling capacitance. The above oscillation circuit unit generates an internal clock swinging to the amplitude corresponding to the internal power supply voltage. The above switch is turned off when the external clock signal having an larger amplitude than the above internal voltage is inputted to the clock terminal, and is turned on when the above oscillation unit oscillates to output the above internal clock signal generated by the oscillation unit from the clock terminal.

The above transistor of the tolerant input circuit includes a first electrode provided with the input signal having the amplitude corresponding to the input signal from the above clock terminal, a second electrode for outputting signals, and a control electrode provided with the given voltage to change the on-resistance between the above first and the second electrodes, and the above transistor outputs the input clock signal from the second electrode after changing the amplitude of the above input clock signal by the above on-resistance value. The above driver drives the output of the above second electrode of the above transistor and outputs the clock signal. Furthermore, the above first coupling capacitance is connected between the above first electrode and the control electrode of the above transistor, and keeps the above on-resistance constant by changing the voltage of the above control electrode when the above input clock signal rises.

First Embodiment

Configuration of the First Embodiment:

FIG. 1 is a view of general configuration diagram of an oscillation diagram (for example, a crystal oscillation circuit) in accordance with the first embodiment of the present invention.

An crystal oscillation circuit according to the first embodiment is used in the case where the oscillation circuit is built in a semiconductor integrated circuit (for example, large scale semiconductor integrated circuit (hereinafter, referred to as "LSI")) and is operated by connecting a crystal oscillator having a certain oscillating frequency, and is used in the case where the oscillation circuit is operated as an externally-inputted-clock driver (for example, the case where an external clock signal is given from another LSI having different (high) operation voltage).

The above crystal oscillation circuit includes clock terminals 1, 2 provided with the complementary external signals xt0, xt1 as LSI external terminals. A main oscillation circuit 10 is connected between the clock terminals 1 and 2, and is connected to an oscillation unit 30 composed by crystal oscillator, etc., through switches 28, 29. The switches 28, 29 consist of transistors conducting on/off operations by a control signal, etc., and the switches 28, 29 are turned on during crystal oscillating and are turned off during the external clock signal inputting.

An input protection circuit 11; NMOS 13 composing a tolerant input circuit having an input protection resistor 12, a node N12, and a limiting resistance, node N13; NMOS 14 inserted between the above node N13 and ground terminal of earth voltage (hereinafter referred to as "GND"); a first-stage driver 15 consisting of, for example, two-input non-conjunction (hereinafter referred to as "NAND") gate; node N15; output limit resistor 16; and the output protection circuit 17 are serially connected, between the clock terminals 1 and 2 in the main oscillation circuit 10.

The input protection circuit 11 includes a P-channel type MOS transistor (hereinafter referred to as "PMOS") 11a, and a NMOS 11b having a gate electrode and a source electrode being diode-connected to each other. Furthermore, the above PMOS 11a and the NMOS 11b are serially connected between a power supply terminal provided with an external power supply voltage VDDE having a higher voltage than an internal power supply voltage VDDI (for example, interface power supply voltage) and a GND terminal. Similarity, an output protection circuit 17 includes a diode-connected PMOS 17a and a diode-connected NMOS 17b, and the above PMOS 17a and NMOS 17b are serially connected between the power supply voltage VDDI and the GND terminal.

Since the crystal oscillation circuit always continues to operate inside the LSI, the power consumption thereof is relatively large. As a measure to the above large power consumption, lessening the current thereof is done by using a regulator-output power supply for a power supply of the first-stage driver 15 consisting of two-input NAND gate activated by an enable signal xt_en. In the case thereof, a low-voltage MOS transistor is used in order to make transistors of the first-stage driver 15 operable at the low voltage, however, since the above low-voltage MOS transistor has often a low rated voltage, the NMOS 13 of the tolerant input circuit is formed on the input side in order to lower the voltage level in the case where the external clock signals xt0, xt1 having the power supply voltage VDDE level are inputted. When the NMOS 13 is used, it becomes easier to control the above gate voltage.

Furthermore, in the main oscillation circuit 10, a LSI internal terminal 18 is included to input the enable signal xt_en used for activating the external clock signals xt0, xt1. The above internal terminal 18 is connected to a constant voltage circuit 21 through a level shifter 20. The level shifter 20 shifts the enable signal xt_en having the power supply voltage VDDI level to the power supply voltage VDDE level, based on the power supply voltages VDDI, VDDE, and then provides the constant circuit 21 with the above shifted signal. The constant voltage circuit 21 generates a stable gate voltage using the output voltage of the level shifter 21 and the threshold voltage Vt of the NMOS, and provides the node N21 on the gate electrode side of the NMOS 13 with the above gate voltage. The above constant voltage circuit 21 includes a PMOS 21a having the gate electrode controlled by output voltage from the level shifter 20, a diode-connected NMOS 21b, the node N21 outputting the stable gate voltage, and two diode-connected NMOSs 21c and 21d, and the above included circuits are serially connected between the power supply voltage VDDE terminal and the GND terminal.

Between from an output-side node N15 of the first-stage driver 15 to an output terminal 26 of the LSI internal terminal, a NMOS 23 diode-connected to the node N15, a Schmitt-type inverter 24, an AND driver 25 consisting of a two-input conjunction (hereinafter referred to as "AND") gate are serially connected. The inverter 24 and the AND driver 25 are operated by the power supply voltage VDDI. The AND driver 25 is activated by the enable signal xt_en, and outputs an internal clock signal clk to an clock output terminal 26 after inputting the output signal from the inverter 24.

An oscillation unit 30 is a circuit built inside or outside the main oscillation circuit 10, and consists of a crystal oscillator 31, two load capacitances 32, 33 connected between the both ends of the above crystal oscillator 31 and the GND terminal, and a feedback resistance 34 connected to the both ends of the crystal oscillator 31. The above oscillation unit 30 is connected to the clock terminals 1, 2 through switches 28, 29 for switching between the operation of the crystal-oscillator 31 and the operation of the external input clock.

As a MOS transistor composing the crystal oscillation circuit on the righter side than the pre-stage of the level shifter 20 and the NMOS 13, a low-voltage MOS transistor is used. The above low-voltage MOS transistor has a low threshold voltage Vt and is able to operate at the internal power supply voltage VDDI level lower than the interface power supply voltage VDDE level. As other MOS transistors composing the crystal oscillation circuit, a MOS transistor having a rated voltage to operate at the interface power supply voltage VDDE is used.

The first embodiment is characterized by inserting a first coupling capacitance 27 having a capacitance of C1 between the source-electrode-side node N12 and the gate-electrode-side node N21 of the NMOS 13.

The First Embodiment Operation:

In the crystal oscillation circuit according to the first embodiment, (1) the operation in the case where the coupling capacitance 27 is not inserted and (2) the operation in the case where the coupling capacitance 27 is inserted will be explained as follows.

(1) Operation in the case where the coupling capacitance 27 is not inserted:

During the crystal oscillation, the enable signal xt_en being inputted to the LSI internal terminal 18 is set to the GND level of "L", and then the first-stage driver 15 and the AND driver 25 become non-active state and do not operate. The switches 28, 29 are turned on, and the internal clock signal generated in the oscillation unit 30 is outputted from the clock terminals 1, 2.

FIG. 2 is a view of timing chart showing the operation waveforms when the external clock is inputted in the case where the coupling capacitance 27 is not inserted in the crystal oscillation circuit of FIG. 1.

In the case where the external clock signals xt0, xt1 having the interface power supply voltage VDDE level are inputted, the switches 28, 29 are turned off for the above external clock inputting operation, and then the oscillation unit 30 is separated. The crystal oscillation circuit is turned on by changing the level of the enable signal xt_en being inputted from the LSI internal terminal 18 from "L" to "H", and then the constant voltage circuit 21 outputs the predetermined voltage (VDDI+ΔV) to the node N21. Subsequently, the external clock signal xt0 having a certain frequency is inputted from the external circuit to the clock terminal 1. The external clock signal xt0 swings from the GND level to the power supply voltage VDDE. The external clock signal xt0 is transmitted to the node N13 through the input protection circuit 11, the input protection resistance 12, the node N12, and the limit resistance NMOS 13. In the operation thereof, the maximum level of the input signal is transferred to the level under the rated voltage of the low-voltage MOS transistor by the effect of the limit resistance NMOS 13. Then, at first-stage driver 15, the above clock signal comes to swing from the GND level to the power supply voltage VDDI level, and is outputted as the internal clock signal clock clk to the clock output terminal 26 through the Schmitt-type inverter 24 and the AND driver 25.

However, the coupling capacitance 27 is not included therein, therefore the following problem arises. Since the voltage of the node N 21 on the gate electrode side of the limit resistance NMOS 13 is kept approximately constant (wherein, a slight coupling can be received due to the junction capacitance of the NMOS 13), the voltage of the node 13 gradually rises as the voltage of the node 12 rises. The limit resistance transistor is composed by the NMOS 13, therefore the threshold voltage Vt of the NMOS 13 rises by the substrate effect of the NMOS caused by the rising of the voltage of the node N13, and then a rising delay of the node N13 occurs. Consequently, the clock signal becomes a signal having shorter "H" period and longer "L" period of the operation duty, and subsequently the duty standard becomes unable to be met in the case where the above duty standard is set to around 50%: 10%.

Therefore, according to the first embodiment of the invention, in order to eliminate the rising delay at the NMOS 13 when the external clock is inputted, the coupling capacitance 27 is inserted between the node N12 and the node N21 so as to restrain the duty variation of the external input clock.

Operation in the case where the coupling capacitance 27 is included:

FIG. 3 is a view of timing chart showing waveforms when the external clock is inputted in the case where the coupling capacitance 27 is included in the crystal oscillation circuit of FIG. 1.

In the case where the coupling capacitance 27 is inserted, node N21 voltage is lifted up by the coupling effect caused by the above coupling capacitance 27 when the node N12 voltage rises, and the same operation is done as the aforementioned operation in the state where no rising delay occurs at the node N13.

Calculation method for the capacitance value C1 of the coupling capacitance 27 according to the first embodiment:

FIG. 4 is a view of explanatory diagram of calculation method for the capacitance value C1 of the coupling capacitance 27 of FIG. 1.

(A) Capacitance value C1 of the coupling capacitance 27:

For example, in the case where the power supply voltage VDDE=3.6V, the power supply voltage VDDI=1.5V, the NMOS 13 threshold voltage Vtn=0.5V, and the node N21 parasitic capacitance value Cf=100 fF (including the gate capacitance value of the NMOS 13), the calculation method is as follows.

Since the node N13 needs to be provided with a signal having the "H" level of the power supply voltage VDDI, the node N21 voltage is set to (VDDI+Vtn). The node N13 voltage gradually rises and then the drain-source voltage Vds of the NMOS 13 falls, when the "H" level of the node N12 (=the power supply voltage VDDE level) is transmitted to the node N13. The threshold voltage Vtn rises by the substrate effect of the NMOS 13. Subsequently, a delay arises at the rising edge of node N13 voltage due to the above falling of the drain-source voltage Vds and the above rising of the threshold voltage Vtn. Since the node N21 voltage can be raised by the coupling 27 capacitance value so as to set off the above delay, the capacitance value C1 of the coupling capacitance 27 can be calculated as follows.

For example, assuming that the node N21 voltage can be raised by 0.5V when the "H" level is inputted in the case where the threshold voltage Vtn rising by the substrate effect of the NMOS 13, etc. is smaller than 0.5V, the capacitance value C1 is calculated as follows.

$$\Delta Qb = Cf\Delta' \quad Cf = 100 \; fF \quad \Delta V = 0.5V$$

$$\Delta Q = 100 \; [fF] \times 0.5 \; [V]$$
$$= 5E - 14$$
$$\Delta Q = C1 \times VDDE$$
$$C1 = \Delta Q / VDDE$$
$$= 13.8 \; [fF]$$

Consequently, the capacitance value C1 varies from the wafer process, however, the capacitance value C1 can be set to from one tenth to one fifth of the parasitic capacitance Cf (including the gate capacitance value of the NMOS 13) as a target.

(B) Critical point of the capacitance C1 of the coupling capacitance 27:

Since the node N13 voltage basically can be set to a level no more than the rated voltage of the internal MOS transistor composing the first-stage driver 15, for example, in the case of the above mentioned (A), when the rated voltage of the internal MOS transistor is set to 3V, the node N21 voltage becomes around 4V in the case where the node N21 voltage is raised by 2V, and then the node N13 voltage surpasses the rated voltage, because the voltage thereof is higher than 3V. The capacitance value C1 in the above case is about 55.5 fF, and then the critical point of the capacitance value C1 is around one half of the parasitic capacitance value of the node N21.

Effect of the First Embodiment:

According to the first embodiment, the on-resistance increasing of the NMOS 13 caused by an insufficient value of the gate-source voltage Vgs of the NMOS 13 can be set off by leverage of the node N21 voltage by the node N12 coupling, and then the rising delay of the node N13 voltage can be eliminated. Consequently, there is an effect that the variation of the operation duty can be restrained.

Second Embodiment

Configuration of the Second Embodiment:

FIG. 5 is a view of general configuration diagram of an oscillation circuit in accordance with the second embodiment of the invention (for example, a crystal oscillation circuit), and the identical elements to ones of FIG. 1 of the first embodiment are provided with the same numerals as in FIG. 1.

In the crystal oscillation circuit according to the second embodiment, a capacitance value C2 of a second coupling capacitance 47 is additionally inserted between the node N21 and the node N15 according to the first embodiment. The capacitance value C2 of the coupling capacitance 47 and the critical point thereof can be as large as the capacitance value C1 of the coupling capacitance 27. Other configurations are the same as in the first embodiment.

Operation of the Second Embodiment:

FIG. 6 is a view of timing chart showing the operation waveforms when the external clock inputs in the case where the coupling capacitance 47 is added to the crystal oscillation circuit of FIG. 5.

The node N21 voltage is lifted up by the coupling effect of the node N12 caused by the above coupling capacitance 27 when the node N12 voltage rises, and the operation is done in the state that there is no rising delay at the node N13. When the node N12 voltage falls, voltage drop caused by the coupling capacitance 27 can be restrained by coupling the rising edge of the node N15 by the coupling capacitance 47.

Effect of the Second Embodiment:

According to the second embodiment, other than the same effect as in the first embodiment, the delay risk at falling of the input clock can be eliminated by the coupling capacitance 47.

FIG. 7(A), (B), and FIG. 8(A)-(F) show the third embodiment of the invention. FIG. 7(A), (B) is a view of configuration diagram of other first-stage drivers than one in FIG. 1 and FIG. 5. FIG. 8(A)-(F) is a view of configuration diagram of other output circuits than one in FIG. 1 and FIG. 5. As shown in FIG. 7(A), the first-stage driver 15 composed by two-input NAND gate of FIG. 1 and FIG. 5 can be composed by two-input non-conjunctions (hereinafter referred to as "NOR") 15-1. Furthermore, as shown in FIG. 7(B), the first-stage driver 15 can be composed by inverters 15-2. However, in the case where the inverter 15-2 is used, the enable signal xt_ev is not inputted, therefore, the first-stage driver cannot be halted. An appropriate circuit-type can be used corresponding to the application.

In FIG. 1, and FIG. 5, the output circuit is composed by the Schmitt-type inverter 24 and the AND driver 25, however, the above output circuit can be composed by other circuits of FIG. 8(A)-(F). A configuration example by two-input NAND gate 25-1 is shown in FIG. 8(A). A configuration example by two-input AND gate 25-2 is shown in FIG. 8(B), a configuration example by two-input NOR gate 25-3 is shown in FIG. 8(C), a configuration example by two-input disjunction (hereinafter, referred to as "OR") gate 254 is shown in FIG. 8(D), a configuration example by inverter 25-5 is shown in FIG. 8(E), and a configuration example by Schmitt-type inverter 25-6 is shown in FIG. 8(F), respectively. However, in the case where the inverters 25-5, 25-6 are used, the enable signal xt_ev is not inputted, therefore, the output circuits cannot be halted. An appropriate circuit-type can be used corresponding to the application.

Furthermore, the present invention is not limited to from the first to the third embodiment shown in the drawings, and various applications or modifications can be done.

For example, the tolerant input circuit can be composed by other transistor such as PMOS, etc. than the NMOS 13. In the case where PMOS is used, the gate voltage needs to be controlled for both of "H" level input and "L" level input thereto. Additionally, the crystal oscillator 31 can be replaced with other oscillators such as ceramic vibrator, etc., or the oscillation unit 30 can be composed by other oscillation-circuits.

What is claimed is:

1. An oscillation circuit comprising:
   an oscillation unit being configured to generate an internal clock signal having an amplitude corresponding to an internal power supply voltage;
   a switch being configured to be turned off when an external clock signal having a larger amplitude than said power supply voltage is provided to a clock terminal and be turned on when said oscillation unit oscillates so as to output said internal clock signal generated by said oscillation unit from said clock terminal;
   a transistor for a tolerant input circuit being configured to include a first electrode being provided with a input clock signal having an amplitude corresponding to input signal from said clock terminal, a second electrode for outputting signals, and a control electrode being provided with a given voltage to change an on-resistance between said first electrode and said second electrode, and said transistor for a tolerant input circuit being configured to change an amplitude of said input clock signal by said on-resistance value and output said input clock signal from said second electrode;

a driver being configured to drive an output signal from said second electrode of said transistor and output said output signal as a clock signal; and a first coupling capacitance being configured to be connected between said first electrode and said control electrode, and being configured to change a voltage of said control electrode at a rising edge of said input clock signal so as to keep said on-resistance constant.

2. The oscillation circuit according to claim 1 further comprising:

a second coupling capacitance being configured to be connected between said control signal and an output terminal of said driver, and to change a voltage of said control electrode when said input clock signal falls so as to keep said on-resistance constant.

3. The oscillation circuit according to claim 1, wherein said oscillation unit includes:

a piezoelectric oscillator; and a feedback resistance being connected between an input terminal and an output terminal of said piezoelectric oscillator.

4. The oscillation circuit according to claim 3, wherein said piezoelectric oscillator is a crystal oscillator.

5. The oscillation circuit according to claim 1, wherein said transistor is a MOS transistor having a gate electrode of said control electrode.

6. The oscillation circuit according to claim 5, wherein said MOS transistor is a N-channel-type MOS transistor.

7. The oscillation circuit according to claim 6, the value of wherein said first coupling capacitance is approximately from one fifth to one tenth of the parasitic capacitance value (including the gate capacitance value thereof however) of said gate electrode of said N-channel-type MOS transistor, and the critical point of said first coupling capacitance value is approximately one half of said parasitic capacitance value.

8. The oscillation circuit according to claim 6, wherein the value of said second coupling capacitance value and the critical point value thereof have approximately the same values as the value of said first coupling capacitance value and the critical point thereof.

\* \* \* \* \*